US012184236B2

(12) United States Patent
Khlat

(10) Patent No.: US 12,184,236 B2
(45) Date of Patent: Dec. 31, 2024

(54) MULTI-AMPLIFIER ENVELOPE TRACKING APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 471 days.

(21) Appl. No.: 17/634,347

(22) PCT Filed: Aug. 13, 2020

(86) PCT No.: PCT/US2020/046053
§ 371 (c)(1),
(2) Date: Feb. 10, 2022

(87) PCT Pub. No.: WO2021/030521
PCT Pub. Date: Feb. 18, 2021

(65) Prior Publication Data
US 2022/0286092 A1 Sep. 8, 2022

Related U.S. Application Data

(60) Provisional application No. 62/886,586, filed on Aug. 14, 2019.

(51) Int. Cl.
*H03F 1/02* (2006.01)
*H03F 3/20* (2006.01)

(52) U.S. Cl.
CPC ............ *H03F 1/0227* (2013.01); *H03F 3/20* (2013.01); *H03F 2200/102* (2013.01);
(Continued)

(58) Field of Classification Search
CPC .... H03F 1/0227; H03F 3/20; H03F 2200/102; H03F 2200/321; H03F 2200/451; H03F 2200/511; H03F 3/189; H03F 3/24
(Continued)

(56) References Cited

U.S. PATENT DOCUMENTS 10,103,926 B1\* 10/2018 Khlat .................... H03F 1/0222
2016/0099686 A1  4/2016 Perreault et al.
(Continued)

FOREIGN PATENT DOCUMENTS

EP      1536556 A2    6/2005

OTHER PUBLICATIONS

International Search Report and Written Opinion for International Patent Application No. PCT/US2020/046053, mailed Nov. 26, 2020, 18 pages.
(Continued)

*Primary Examiner* — Hieu P Nguyen
(74) *Attorney, Agent, or Firm* — Withrow & Terranova, P.L.L.C.

(57) ABSTRACT

A multi-amplifier envelope tracking (ET) apparatus is provided. The multi-amplifier ET apparatus includes an ET integrated circuit (ETIC). The ETIC includes a first voltage circuit that generates the first ET voltage based on a first supply voltage and a first time-variant target voltage. The ETIC also includes a second voltage circuit that generates the second ET voltage based on a second supply voltage and a second time-variant target voltage. In embodiments disclosed herein, the ETIC is configured to determine the first supply voltage and the second supply voltage in accordance to the first time-variant target voltage and the second time-variant target voltage, respectively. As a result, both the first and the second voltage circuits can operate with optimal efficiency, thus helping to improve overall operating efficiency of the multi-amplifier ET apparatus.

21 Claims, 5 Drawing Sheets

(52) U.S. Cl.
CPC .. *H03F 2200/321* (2013.01); *H03F 2200/451* (2013.01); *H03F 2200/511* (2013.01)

(58) Field of Classification Search
USPC ........................................ 330/291, 297, 136
See application file for complete search history.

(56) References Cited

U.S. PATENT DOCUMENTS

| | | |
|---|---|---|
| 2016/0181995 A1 | 6/2016 | Nentwig et al. |
| 2018/0287563 A1 | 10/2018 | Henzler et al. |
| 2018/0309409 A1 | 10/2018 | Khlat |
| 2019/0089310 A1 | 3/2019 | Khlat et al. |
| 2019/0222178 A1 | 7/2019 | Khlat et al. |

OTHER PUBLICATIONS

Examination Report for European Patent Application No. 20764202.6, mailed May 31, 2024, 10 pages.

\* cited by examiner

MULTI-AMPLIFIER ENVELOPE TRACKING APPARATUS

RELATED APPLICATION

This application is a 35 USC 371 national phase filing of International Application No. PCT/US2020/046053, filed Aug. 13, 2020, which claims the benefit of U.S. provisional patent application No. 62/886,586, filed on Aug. 14, 2019, the disclosures of which are incorporated herein by reference in their entireties.

FIELD OF THE DISCLOSURE

The technology of the disclosure relates generally to an envelope tracking (ET) amplifier apparatus in a wireless communication device.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as long-term evolution (LTE) and fifth-generation new-radio (5G-NR). To achieve the higher data rates in mobile communication devices, sophisticated power amplifiers may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Envelope tracking (ET) is a power management technology designed to improve efficiency levels of power amplifiers to help reduce power consumption and thermal dissipation in a mobile communication device. In an ET system, an ET power amplifier(s) amplifies an RF signal(s) based on time-variant voltages generated in accordance to time-variant amplitudes of the RF signal(s). The time-variant voltages increase as the time-variant amplitudes rise and decrease as the time-variant amplitudes fall. As such, the time-variant voltages correspond to a time-variant voltage envelope that tracks a time-variant power envelope associated with the time-variant signal amplitudes of the RF signal(s). Notably, the better the time-variant voltage envelope tracks the time-variant power envelope, the higher efficiency can be achieved in the ET power amplifier(s). In this regard, it may be necessary for the ET system to constantly adjust the time-variant voltages applied to the ET power amplifier(s) to ensure that the ET power amplifier(s) can consistently operate at a desired efficiency for any given instantaneous power requirement of the RF signal(s).

SUMMARY

Aspects disclosed in the detailed description include a multi-amplifier envelope tracking (ET) apparatus. The multi-amplifier ET apparatus includes an ET integrated circuit (ETIC). In a non-limiting example, the ETIC is configured to provide a first ET voltage and a second ET voltage to at least two power amplifier circuits for amplifying a radio frequency (RF) signal(s). The ETIC includes a first voltage circuit that generates the first ET voltage based on a first supply voltage and a first time-variant target voltage. The ETIC also includes a second voltage circuit that generates the second ET voltage based on a second supply voltage and a second time-variant target voltage. In embodiments disclosed herein, the ETIC is configured to determine the first supply voltage and the second supply voltage in accordance to the first time-variant target voltage and the second time-variant target voltage, respectively. As a result, both the first and the second voltage circuits can operate with optimal efficiency, thus helping to improve overall operating efficiency of the multi-amplifier ET apparatus.

In one aspect, a multi-amplifier ET apparatus is provided. The multi-amplifier ET apparatus includes an ETIC. The ETIC includes a first voltage circuit configured to generate a first ET voltage based on a first supply voltage and a first time-variant target voltage. The ETIC also includes a second voltage circuit configured to generate a second ET voltage based on a second supply voltage and a second time-variant target voltage. The ETIC also includes a supply voltage circuit configured to generate a plurality of supply voltages. The ETIC also includes a control circuit coupled to the supply voltage circuit. The control circuit is configured to dynamically select the first supply voltage from the plurality of supply voltages based on the first time-variant target voltage. The control circuit is also configured to provide the selected first supply voltage to the first voltage circuit. The control circuit is also configured to dynamically select the second supply voltage from the plurality of supply voltages based on the second time-variant target voltage. The control circuit is also configured to provide the selected second supply voltage to the second voltage circuit.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1:
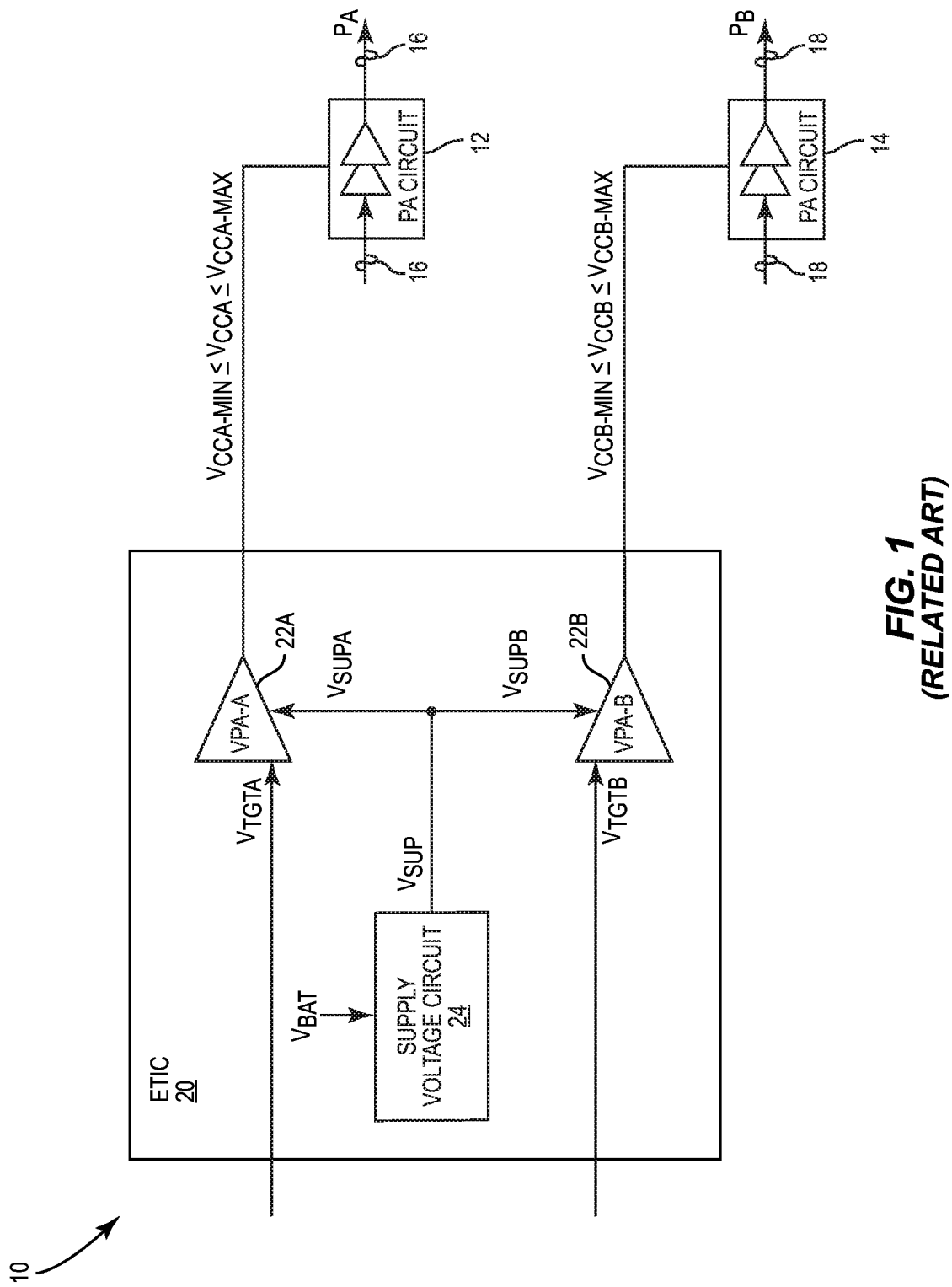
FIG. 1 is a schematic diagram of an exemplary existing ET apparatus that may suffer an efficiency degradation when a pair of power amplifier circuits are operating concurrently to amplify a pair of RF signals.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a multi-amplifier envelope tracking (ET) apparatus. The multi-amplifier ET apparatus includes an ET integrated circuit (ETIC). In a non-limiting example, the ETIC is configured to provide a first ET voltage and a second ET voltage to at least two power amplifier circuits for amplifying a radio frequency (RF) signal(s). The ETIC includes a first voltage circuit that generates the first ET voltage based on a first supply voltage and a first time-variant target voltage. The ETIC also includes a second voltage circuit that generates the second ET voltage based on a second supply voltage and a second time-variant target voltage. In embodiments disclosed herein, the ETIC is configured to determine the first supply voltage and the second supply voltage in accordance to the first time-variant target voltage and the second time-variant target voltage, respectively. As a result, both the first and the second voltage circuits can operate with optimal efficiency, thus helping to improve overall operating efficiency of the multi-amplifier ET apparatus.

Figure 2:
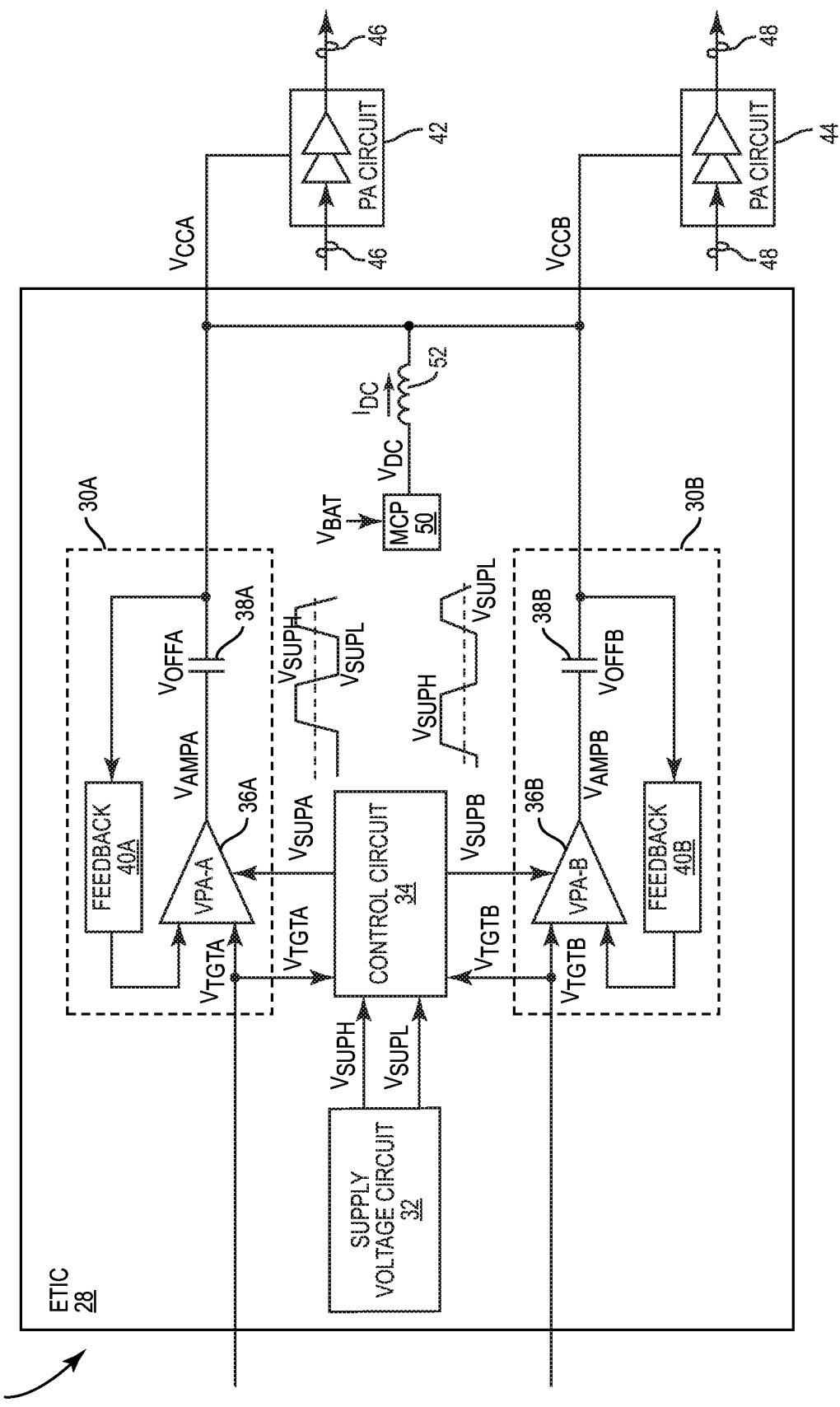
FIG. 2 is a schematic diagram of an exemplary multi-amplifier ET apparatus configured according to one embodiment of the present disclosure to achieve improved operating efficiency over the existing ET apparatus of FIG. 1.

Before discussing the multi-amplifier ET apparatus according to the present disclosure, starting at FIG. 2, a brief discussion of an existing multi-amplifier ET apparatus is first provided with reference to FIG. 1.

FIG. 1 is a schematic diagram of an exemplary existing ET apparatus 10 that may suffer an efficiency degradation when a first power amplifier circuit 12 and a second power amplifier circuit 14 are operating concurrently to amplify a first RF signal 16 and a second RF signal 18. In a non-limiting example, the first power amplifier circuit 12 is configured to amplify the first RF signal 16 to a first power $P_A$ based on a first ET voltage $V_{CCA}$ and the second power amplifier circuit 14 is configured to amplify the second RF signal 18 to a second power level $P_B$ based on a second ET voltage $V_{CCB}$. Understandably, the first RF signal 16 and the second RF signal 18 can each correspond to a respective time-variant power envelope bounded by a peak (highest power) and a bottom (lowest power). Herein, the first power $P_A$ and the second power $P_B$ refer to a root-mean-square (RMS) power of the first RF signal 16 and the second RF signal 18, respectively.

The existing ET apparatus 10 includes an ETIC 20 configured to generate the first ET voltage $V_{CCA}$ and the second ET voltage $V_{CCB}$. More specifically, the ETIC 20 includes a first voltage amplifier 22A (denoted as "VPA-A") and a second voltage amplifier 22B (denoted as "VPA-B"). The first voltage amplifier 22A is configured to generate the first ET voltage $V_{CCA}$ based on a first supply voltage $V_{SUPA}$ and a first time-variant target voltage $V_{TGTA}$. By generating the first ET voltage $V_{CCA}$ based on the first time-variant target voltage $V_{TGTA}$, the first ET voltage $V_{CCA}$ will correspond to a first time-variant voltage envelope that tracks (rises and falls) the first time-variant target voltage $V_{TGTA}$. The second voltage amplifier 22B is configured to generate the second ET voltage $V_{CCB}$ based on a second supply voltage $V_{SUPB}$ and a second time-variant target voltage $V_{TGTB}$. By generating the second ET voltage $V_{CCB}$ based on the second time-variant target voltage $V_{TGTB}$, the second ET voltage $V_{CCB}$ will correspond to a second time-variant voltage envelope that tracks (rises and falls) the second time-variant target voltage $V_{TGTB}$.

For the first power amplifier circuit 12 to operate at optimal efficiency and linearity, the first ET voltage $V_{CCA}$ needs to track closely the time-variant power envelope of the first RF signal 16. In this regard, the first ET voltage $V_{CCA}$ varies between a first maximum ET voltage $V_{CCA\text{-}MAX}$, which corresponds to the highest power (peak) of the first RF signal 16, and a first minimum ET voltage $V_{CCA\text{-}MIN}$ that corresponds to the lowest power (bottom) of the first RF signal 16. Likewise, for the second power amplifier circuit 14 to operate at optimal efficiency and linearity, the second ET voltage $V_{CCB}$ also needs to track closely the time-variant power envelope of the second RF signal 18. Similarly, the second ET voltage $V_{CCB}$ varies between a second maximum ET voltage $V_{CCB\text{-}MAX}$, which corresponds to the highest power (peak) of the second RF signal 18, and a second minimum ET voltage $V_{CCB\text{-}MIN}$ that corresponds to the lowest power (bottom) of the second RF signal 18.

The ETIC 20 includes a supply voltage circuit 24 configured to generate a supply voltage $V_{SUP}$ based on a battery voltage $V_{BAT}$. The supply voltage circuit 24 provides the supply voltage $V_{SUP}$ to the first voltage amplifier 22A as the first supply voltage $V_{SUPA}$ and to the second voltage amplifier 22B as the second supply voltage $V_{SUPB}$. The first supply voltage $V_{SUPA}$ and the second supply voltage $V_{SUPB}$ may be used to drive respective output states (not shown) of the first voltage amplifier 22A and the second voltage amplifier 22B. In this regard, for the first voltage amplifier 22A to operate with optimal efficiency, the first supply voltage $V_{SUPA}$ should equal the first maximum ET voltage $V_{CCA\text{-}MAX}$ plus a headroom ($V_{SUPA}=V_{CCA\text{-}MAX}+\text{Headroom}$). Likewise, for the second voltage amplifier 22B to operate with optimal efficiency, the second supply voltage $V_{SUPB}$ should equal the second maximum ET voltage $V_{CCB\text{-}MAX}$ plus a headroom ($V_{SUPB}=V_{CCB\text{-}MAX}+\text{Headroom}$).

In some cases, the first RF signal 16 and the second RF signal 18 may correspond to different time-variant power envelopes. For example, the first maximum ET voltage $V_{CCA\text{-}MAX}$ is consistently higher than the second maximum ET voltage $V_{CCB\text{-}MAX}$ ($V_{CCA\text{-}MAX}>V_{CCB\text{-}MAX}$). However, since the supply voltage circuit 24 can only provide the supply voltage $V_{SUP}$ as both the first supply voltage $V_{SUPA}$ and the second supply voltage $V_{SUPB}$, the supply voltage circuit 24 needs to generate the supply voltage $V_{SUP}$ based on the higher maximum ET voltage (e.g., $V_{CCA\text{-}MAX}$) among the first maximum ET voltage $V_{CCA\text{-}MAX}$ and the second maximum ET voltage $V_{CCB\text{-}MAX}$ to avoid amplitude clipping. As a result, the second voltage amplifier 22B will receive a higher than optimal supply voltage, which can cause the second voltage amplifier 22B to suffer an efficiency degradation. Although it may be possible to employ two separate supply voltage circuits in the ETIC 20 for generating the first supply voltage $V_{SUPA}$ and the second supply voltage $V_{SUPB}$, doing so would inevitably lead to an increased footprint, cost, and power consumption of the ETIC 20. Thus, it may be desirable to improve operating efficiency of the ETIC 20 without increasing footprint, cost, and power consumption.

In this regard, FIG. 2 is a schematic diagram of an exemplary multi-amplifier ET apparatus 26 configured according to one embodiment of the present disclosure to achieve improved operating efficiency over the existing ET apparatus 10 of FIG. 1. The multi-amplifier ET apparatus 26 includes an ETIC 28. The ETIC 28 includes a first voltage circuit 30A, a second voltage circuit 30B, a supply voltage circuit 32, and a control circuit 34, which can be any type of microcontroller or a field-programmable gate array (FPGA), as an example. It should be appreciated that the ETIC 28 can support additional voltage circuits based on the operational principles discussed hereinafter.

The first voltage circuit 30A is configured to generate a first ET voltage $V_{CCA}$ based on a first supply voltage $V_{SUPA}$ and a first time-variant target voltage $V_{TGTA}$. In a non-limiting example, the first voltage circuit 30A can receive the first time-variant target voltage $V_{TGTA}$ from a transceiver circuit (not shown). By generating the first ET voltage $V_{CCA}$ based on the first time-variant target voltage $V_{TGTA}$, the first ET voltage $V_{CCA}$ will correspond to a first time-variant voltage envelope that tracks (rises and falls) the first time-variant target voltage $V_{TGTA}$. Similar to the first ET voltage $V_{CCA}$ in FIG. 1, the first ET voltage $V_{CCA}$ in FIG. 2 is also bounded by a first maximum ET voltage $V_{CCA\text{-}MAX}$ and a first minimum ET voltage $V_{CCA\text{-}MIN}$.

The second voltage circuit 30B is configured to generate a second ET voltage $V_{CCB}$ based on a second supply voltage $V_{SUPB}$ and a second time-variant target voltage $V_{TGTB}$. In a non-limiting example, the first voltage circuit 30A can receive the first time-variant target voltage $V_{TGTA}$ from the same transceiver circuit (not shown). By generating the second ET voltage $V_{CCB}$ based on the second time-variant target voltage $V_{TGTB}$, the second ET voltage $V_{CCB}$ will correspond to a second time-variant voltage envelope that tracks (rises and falls) the second time-variant target voltage $V_{TGTB}$. Similar to the second ET voltage $V_{CCB}$ in FIG. 1, the second ET voltage $V_{CCB}$ in FIG. 2 is also bounded by a second maximum ET voltage $V_{CCB\text{-}MAX}$ and a second minimum ET voltage $V_{CCB\text{-}MIN}$.

Notably, the first time-variant target voltage $V_{TGTA}$ can be identical to or different from the second time-variant target voltage $V_{TGTB}$. Accordingly, the first time-variant voltage envelope of the first ET voltage $V_{CCA}$ can be identical to or different from the second time-variant voltage envelope of the second ET voltage $V_{CCB}$. As a result, the first maximum ET voltage $V_{CCA\text{-}MAX}$ can be identical to or different from the second maximum ET voltage $V_{CCB\text{-}MAX}$. In examples discussed hereinafter, it is assumed that the first time-variant voltage envelope of the first ET voltage $V_{CCA}$ is different from the second time-variant voltage envelope of the second ET voltage $V_{CCB}$ and the first maximum ET voltage $V_{CCA\text{-}MAX}$ is higher than the second maximum ET voltage $V_{CCB\text{-}MAX}$.

The supply voltage circuit 32 is configured to generate a low constant voltage $V_{SUPL}$ and a high constant voltage $V_{SUPH}$ greater than the low constant voltage $V_{SUPL}$ ($V_{SUPH}=x*V_{SUPL}$, $x>1$). The control circuit 34 is configured to selectively provide any of the low constant voltage $V_{SUPL}$ and the high constant voltage $V_{SUPH}$ to any of the first voltage circuit 30A and the second voltage circuit 30B based on the first time-variant target voltage $V_{TGTA}$ and the second time-variant target voltage $V_{TGTB}$. In a non-limiting example, the control circuit 34 provides the low constant voltage $V_{SUPL}$ to the first voltage circuit 30A as the first supply voltage $V_{SUPA}$ if the first time-variant target voltage $V_{TGTA}$ is below ($\leq$) a first threshold voltage and provides the high constant voltage $V_{SUPH}$ to the first voltage circuit 30A as the first supply voltage $V_{SUPA}$ if the first time-variant target voltage $V_{TGTA}$ is above (>) the first threshold voltage. As such, the first supply voltage $V_{SUPA}$ toggles dynamically between the low constant voltage $V_{SUPL}$ and the high constant voltage $V_{SUPH}$ in response to rises and falls of the first time-variant target voltage $V_{TGTA}$. Notably, the control circuit 34 may also provide the low constant voltage $V_{SUPL}$ or the high constant voltage $V_{SUPH}$ to the first voltage circuit 30A as the first supply voltage $V_{SUPA}$ regardless of the first time-variant target voltage $V_{TGTA}$.

Likewise, the control circuit 34 provides the low constant voltage $V_{SUPL}$ to the second voltage circuit 30B as the second supply voltage $V_{SUPB}$ if the second time-variant target voltage $V_{TGTB}$ is below ($\leq$) a second threshold voltage, which can be identical to or different from the first threshold voltage, and provides the high constant voltage $V_{SUPH}$ to the second voltage circuit 30B as the second supply voltage $V_{SUPB}$ if the second time-variant target voltage $V_{TGTB}$ is above (>) the second threshold voltage. As such, the second supply voltage $V_{SUPB}$ toggles dynamically between the low constant voltage $V_{SUPL}$ and the high constant voltage $V_{SUPH}$ in response to rises and falls of the second time-variant target voltage $V_{TGTB}$. Notably, the control circuit 34 may also provide the low constant voltage $V_{SUPL}$ or the high constant voltage $V_{SUPH}$ to the second voltage circuit 30B as the second supply voltage $V_{SUPB}$ regardless of the second time-variant target voltage $V_{TGTB}$.

By dynamically adjusting the first supply voltage $V_{SUPA}$ and the second supply voltage $V_{SUPB}$ based on the first time-variant target voltage $V_{TGTA}$ and the second time-variant target voltage $V_{TGTB}$, it is possible to improve operating efficiencies of the first voltage circuit 30A and the second voltage circuit 30B. As a result, it is possible to improve overall operating efficiency of the multi-amplifier ET apparatus 26.

In a non-limiting example, the first voltage circuit 30A includes a first voltage amplifier 36A (denoted as "VPA-A"), a first offset capacitor 38A, and a first feedback loop 40A. The first voltage amplifier 36A is configured to generate a first initial ET voltage $V_{AMPA}$ based on the first supply voltage $V_{SUPA}$ and the first time-variant target voltage $V_{TGTA}$. In a non-limiting example, the first supply voltage $V_{SUPA}$ is applied to an output stage (not shown) of the first voltage amplifier 36A. The first offset capacitor 38A is configured to raise the first initial ET voltage $V_{AMPA}$ by a first offset voltage $V_{OFFA}$ (e.g., 0.8 V) to generate the first ET voltage $V_{CCA}$ ($V_{CCA}=V_{AMPA}+V_{OFFA}$). The first feedback loop 40A is configured to provide a feedback of the first ET voltage $V_{CCA}$ to the first voltage amplifier 36A, thus making the first voltage circuit 30A a closed-loop ET voltage circuit.

Similarly, the second voltage circuit 30B includes a second voltage amplifier 36B (denoted as "VPA-B"), a second offset capacitor 38B, and a second feedback loop 40B. The second voltage amplifier 36B is configured to generate a second initial ET voltage $V_{AMPB}$ based on the second supply voltage $V_{SUPB}$ and the second time-variant target voltage $V_{TGTB}$. In a non-limiting example, the second supply voltage $V_{SUPB}$ is applied to an output stage (not shown) of the second voltage amplifier 36B. The second offset capacitor 38B is configured to raise the second initial ET voltage $V_{AMPB}$ by a second offset voltage $V_{OFFB}$ (e.g., 0.8 V) to generate the second ET voltage $V_{CCB}$ ($V_{CCB}=V_{AMPB}+V_{OFFB}$). The second feedback loop 40B is configured to provide feedback of the second ET voltage $V_{CCB}$ to the second voltage amplifier 36AB, thus making the second voltage circuit 30B a closed-loop ET voltage circuit.

The multi-amplifier ET apparatus 26 includes a first power amplifier circuit 42 and a second power amplifier circuit 44. The first power amplifier circuit 42 is configured to amplify a first RF signal 46 based on the first ET voltage $V_{CCA}$. The second power amplifier circuit 44 is configured to amplify a second RF signal 48 based on the second ET voltage $V_{CCB}$. The first power amplifier circuit 42 and the second power amplifier circuit 44 can amplify the first RF signal 46 and the second RF signal 48 either concurrently or independently. The first RF signal 46 may be the same as or different from the second RF signal 48. In a non-limiting example, the first RF signal 46 and the second RF signal 48 are provided by the same transceiver circuit (not shown) that generates the first time-variant target voltage $V_{TGTA}$ and the second time-variant target voltage $V_{TGTB}$. Notably, the multi-amplifier ET apparatus 26 can include additional power amplifier circuits for amplifying additional RF signals. Accordingly, the ETIC 28 may include additional voltage circuits to support the additional power amplifier circuit.

The ETIC 28 can include a multi-level charge pump (MCP) 50 and a power inductor 52. The MCP 50 is configured to generate a low-frequency voltage $V_{DC}$ that is proportional to a battery voltage $V_{BAT}$ (e.g., $V_{DC}=0*V_{BAT}$, $1*V_{BAT}$, or $2*V_{BAT}$). The power inductor 52 is configured to induce a low-frequency current $I_{DC}$ based on the low-frequency voltage $V_{DC}$. The first power amplifier circuit 42 and the second power amplifier circuit 44 may be coupled to the power inductor 52 to receive the low-frequency current $I_{DC}$. In this regard, the low-frequency current $I_{DC}$ can be adjusted by adjusting the low-frequency voltage $V_{DC}$. In a non-limiting example, the control circuit 34 can cause the MCP 50 to adjust the low-frequency voltage $V_{DC}$ and, thus, the low-frequency current $I_{DC}$ based on rises and falls of the first ET voltage $V_{CCA}$ and/or the second ET voltage $V_{CCB}$.

Figure 3:
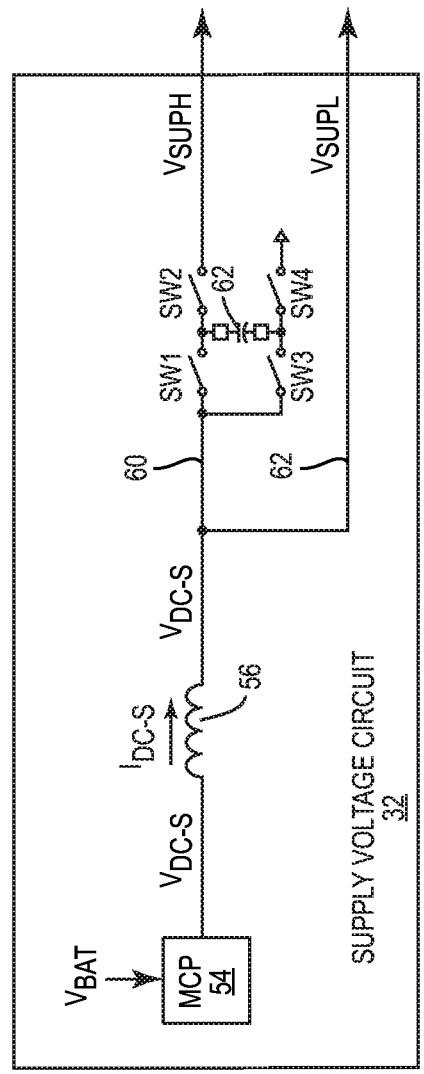
FIG. 3 is a schematic diagram providing an exemplary configuration of a supply voltage circuit provided in the multi-amplifier ET apparatus of FIG. 2.

FIG. 3 is a schematic diagram providing an exemplary configuration of the supply voltage circuit 32 in the multi-amplifier ET apparatus 26 of FIG. 2. Common elements between FIGS. 2 and 3 are shown therein with common element numbers and will not be re-described herein.

In a non-limiting example, the supply voltage circuit 32 includes a supply MCP 54, a supply power inductor 56, a lower voltage path 58, and a higher voltage path 60. The supply MCP 54 is configured to generate a low-frequency supply voltage $V_{DC-S}$ that is proportional to the battery voltage $V_{BAT}$ (e.g., $V_{DC-S}=0*V_{BAT}$, $1*V_{BAT}$, or $2*V_{BAT}$). The supply power inductor 56 is configured to induce a low-frequency current $I_{DC-S}$ based on the low-frequency supply voltage $V_{DC-S}$. The lower voltage path 58 is coupled to the supply power inductor 56 and configured to output the low-frequency supply voltage $V_{DC-S}$ as the low constant voltage $V_{SUPL}$. The higher voltage path 60 is coupled to the supply power inductor 56 and configured to boost the low-frequency supply voltage $V_{DC-S}$ to generate the high constant voltage $V_{SUPH}$.

In a non-limiting example, the higher voltage path 60 includes a first switch SW1, a second switch SW2, a third switch SW3, and a fourth switch SW4. The first switch SW1 and the second switch SW2 are coupled in series. The third switch SW3 and the fourth switch SW4 are coupled in series and in parallel to the first switch SW1 and the second switch SW2. The higher voltage path 60 includes a fly capacitor 62 having one end coupled in between the first switch SW1 and the second switch SW2, and another end coupled in between the third switch SW3 and the fourth switch SW4.

In a non-limiting example, the supply voltage circuit 32 can be configured to generate the low constant voltage $V_{SUPL}$ that equals the low-frequency supply voltage $V_{DC-S}$ ($V_{SUPL}=V_{DC-S}$) and the high constant voltage $V_{SUPH}$ proportional to the low-frequency supply voltage $V_{DC-S}$ ($V_{SUPH}=y*V_{DC-S}$, y>1). To output the low constant voltage $V_{SUPL}$ at the low-frequency supply voltage $V_{DC-S}$, the switches SW1, SW2, SW3, and SW4 are kept open.

To output the high constant voltage $V_{SUPH}$ at, for example, two times the low-frequency supply voltage $V_{DC-S}$ ($V_{SUPH}=2*V_{DC-S}$), the fly capacitor 62 is first charged by closing the first switch SW1 and the fourth switch SW4 and opening the second switch SW2 and the third switch SW3. Subsequently, the fly capacitor 62 can be discharged by opening the first switch SW1 and the fourth switch SW4 and closing the second switch SW2 and the third switch SW3. Accordingly, the higher voltage path 60 can output the high constant voltage $V_{SUPH}$ at $2 \times V_{DC-S}$. It should be appreciated that the supply voltage circuit 32 can be configured to include additional voltage paths to provide additional constant voltages.

Figure 4:
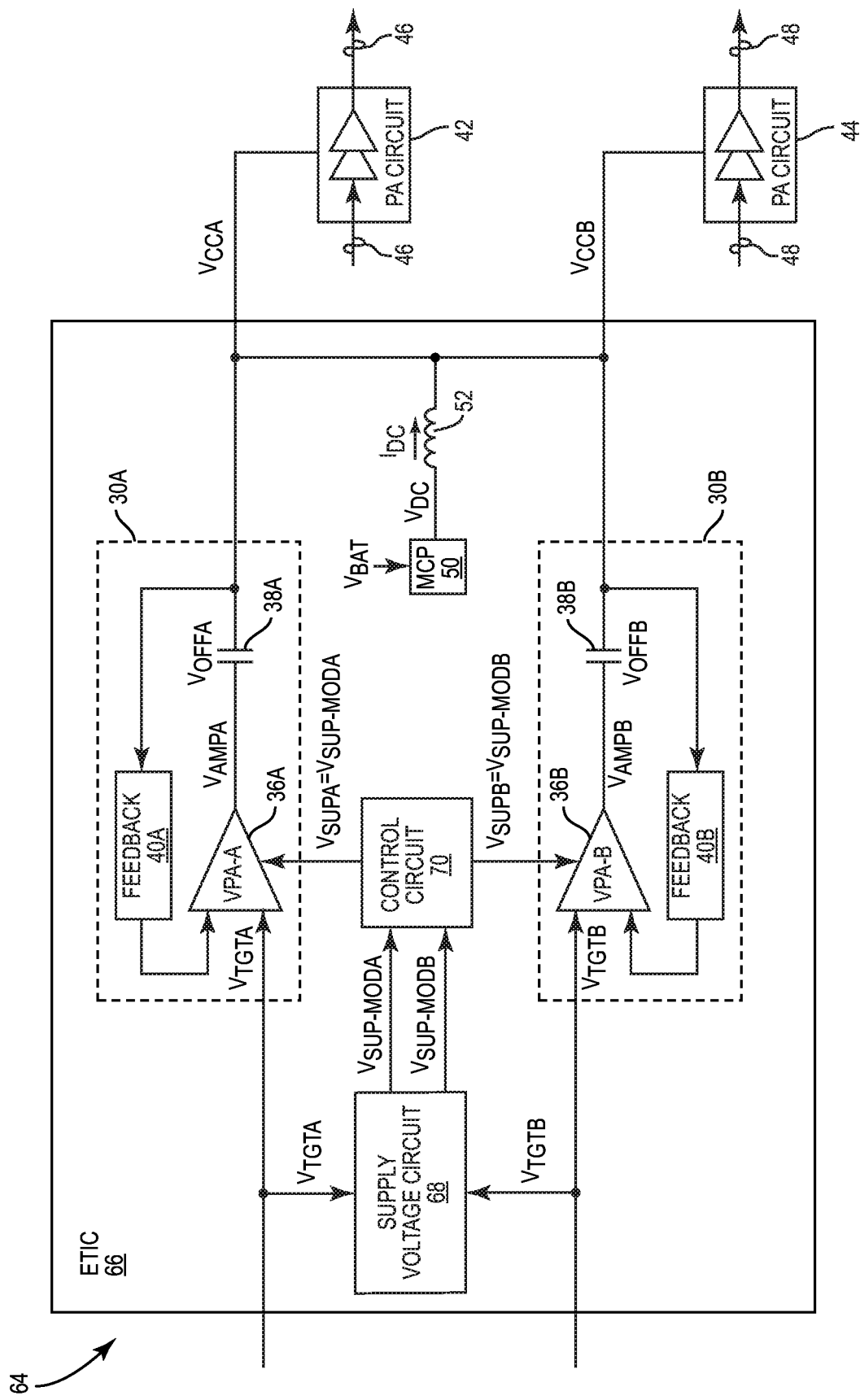
FIG. 4 is a schematic diagram of an exemplary multi-amplifier ET apparatus configured according to another embodiment of the present disclosure.

Alternative to making the supply voltage circuit 32 generate the low-constant voltage $V_{SUPL}$ and the high constant voltage $V_{SUPL}$, it is also possible to reconfigure the supply voltage circuit 32 to provide modulated supply voltages to the first voltage amplifier 36A and the second voltage amplifier 36B. In this regard, FIG. 4 is a schematic diagram of an exemplary multi-amplifier ET apparatus 64 configured according to another embodiment of the present disclosure. Common elements between FIGS. 2 and 4 are shown therein with common element numbers and will not be re-described herein.

The multi-amplifier ET apparatus 64 includes an ETIC 66, which further includes a supply voltage circuit 68 and a control circuit 70. The supply voltage circuit 68 receives the first time-variant target voltage $V_{TGTA}$ and the second time-variant target voltage $V_{TGTB}$ (e.g., from the same transceiver circuit as in FIG. 2). Accordingly, the supply voltage circuit 68 can generate a first modulated voltage $V_{SUP-MODA}$ that is modulated based on the first time-variant target voltage $V_{TGTA}$ and a second modulated voltage $V_{SUP-MODA}$ that is modulated based on the second time-variant target voltage $V_{TGTB}$. The control circuit 70 is configured to provide the first modulated voltage $V_{SUP-MODA}$ to the first voltage amplifier 36A as the first supply voltage $V_{SUPA}$ and provide the second modulated voltage $V_{SUP-MODA}$ to the second voltage amplifier 36B as the second supply voltage $V_{SUPB}$.

Figure 5:
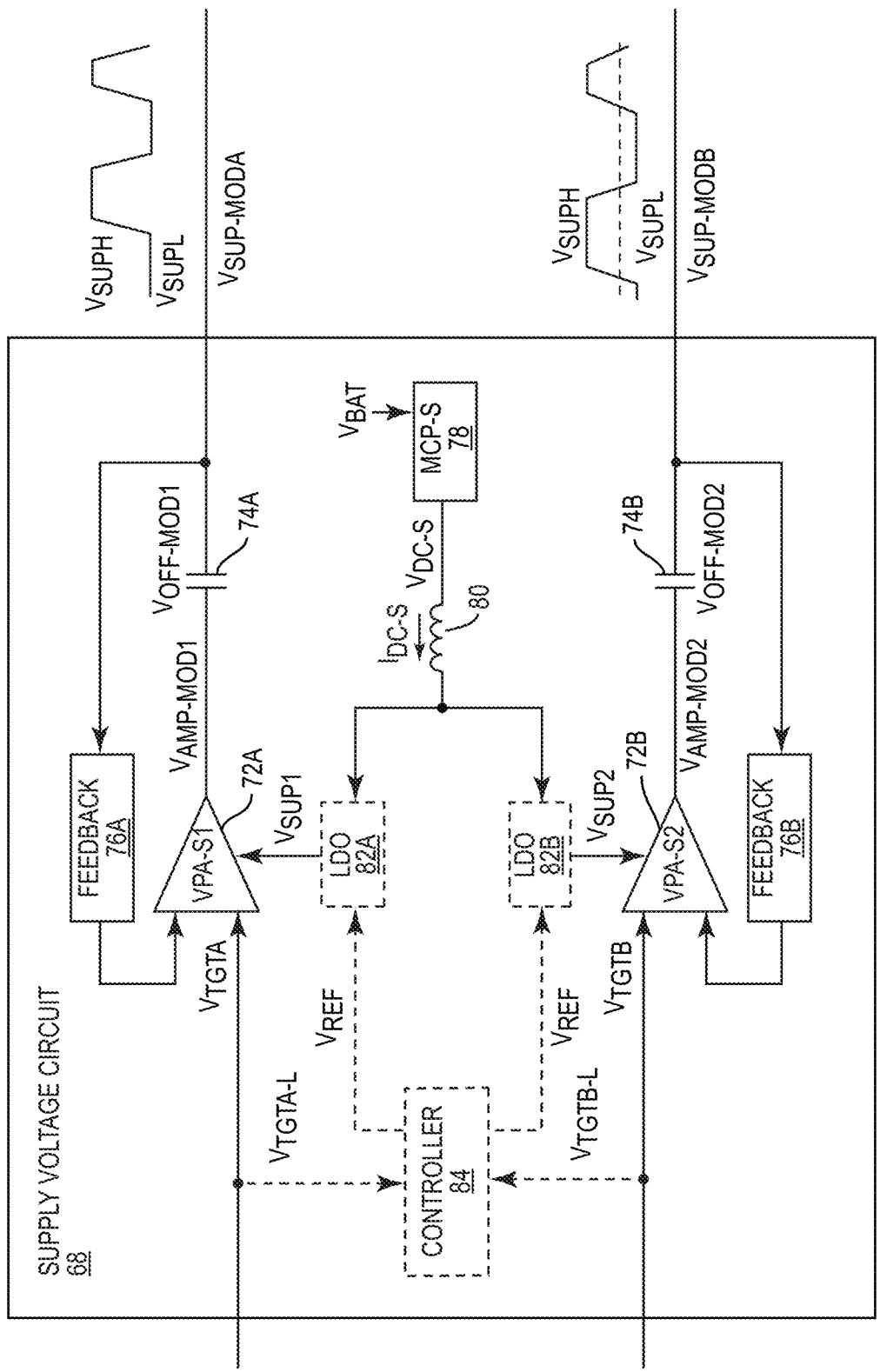
FIG. 5 is a schematic diagram providing an exemplary configuration of a supply voltage circuit provided in the multi-amplifier ET apparatus of FIG. 4.

FIG. 5 is a schematic diagram providing an exemplary configuration of the supply voltage circuit 68 in the multi-amplifier ET apparatus 64 of FIG. 4. Common elements between FIGS. 4 and 5 are shown therein with common element numbers and will not be re-described herein.

In a non-limiting example, the supply voltage circuit 68 includes a first amplifier 72A (denoted as "VPA-S1"), a first capacitor 74A, a first feedback path 76A, a second amplifier 72B (denoted as "VPA-S2"), a second capacitor 74B, and a second feedback path 76B. The first amplifier 72A is configured to generate a first initial modulated voltage $V_{AMP-MOD1}$ based on a first voltage $V_{SUP1}$ and the first time-variant target voltage $V_{TGTA}$. The first capacitor 74A is configured to raise the first initial modulated voltage $V_{AMP-MOD1}$ by an offset voltage $V_{OFF-MOD1}$ to generate the first modulated voltage $V_{SUP-MODA}$ ($V_{SUM-MODA} = V_{AMP-MOD1} + V_{OFF-MOD1}$). The first feedback path 76A provides a copy of the first modulated voltage $V_{SUP-MODA}$ to the first amplifier 72A.

Similarly, the second amplifier 72B is configured to generate a second initial modulated voltage $V_{AMP-MOD2}$ based on a second voltage $V_{SUP2}$ and the second time-variant target voltage $V_{TGTB}$. The second capacitor 74B is configured to raise the second initial modulated voltage $V_{AMP-MOD2}$ by an offset voltage $V_{OFF-MOD2}$ to generate the second modulated voltage $V_{SUP-MODB}$ ($V_{SUM-MODB} = V_{AMP-MOD2} + V_{OFF-MOD2}$). The second feedback path 76B provides a copy of the second modulated voltage $V_{SUP-MODB}$ to the second amplifier 72B.

The supply voltage circuit 68 may include a supply MCP 78 (denoted as "MCP-S"), a supply power inductor 80, a first low-dropout (LDO) circuit 82A, a second LDO circuit 82B, and a controller 84. The supply MCP 78 is configured to generate a low-frequency supply voltage $V_{DC-S}$ that is proportional to the battery voltage $V_{BAT}$. The supply power inductor 80 is configured to induce a low-frequency supply current $I_{DC-S}$ based on the low-frequency supply voltage $V_{DC-S}$. The first LDO circuit 82A is coupled to the supply power inductor 80 and configured to generate the first voltage $V_{SUP1}$ based on the low-frequency supply voltage $V_{DC-S}$. The second LDO circuit 82B is coupled to the supply power inductor 80 and configured to generate the second voltage $V_{SUP2}$ based on the low-frequency supply voltage $V_{DC-S}$. The controller 84 is configured to provide a reference voltage $V_{REF}$ to the first LDO circuit 82A and the second LDO circuit 82B for generating the first voltage $V_{SUP1}$ and the second voltage $V_{SUP2}$.

In one embodiment, the controller 84 receives a first low target voltage $V_{TGTA-L}$ that corresponds to a minimum of the first time-variant target voltage $V_{TGTA}$ and a second low target voltage $V_{TGTB-L}$ that corresponds to a minimum of the second time-variant target voltage $V_{TGTB}$. Accordingly, the controller 84 generates the reference voltage $V_{REF}$ as a higher one of the first low target voltage $V_{TGTA-L}$ and the second low target voltage $V_{TGTB-L}$ ($V_{REF}$=MAX [$V_{TGTA-L}$, $V_{TGTB-L}$]). Accordingly, the supply voltage circuit 68 can modulate each of the first modulated voltage $V_{SUP-MODA}$ and the second modulated voltage $V_{SUP-MODB}$ to toggle between the low constant voltage $V_{SUPL}$ and the high constant voltage $V_{SUPH}$. Notably, the controller 84 may generate the reference voltage $V_{REF}$ as a constant voltage or as a modulated voltage.

Those skilled in the art will recognize improvements and modifications to the embodiments of the present disclosure. All such improvements and modifications are considered within the scope of the concepts disclosed herein and the claims that follow.

What is claimed is:

1. A multi-amplifier envelope tracking (ET) apparatus comprising:
   an ET integrated circuit (ETIC) comprising:
      a first voltage circuit configured to generate a first ET voltage based on a first supply voltage and a first time-variant target voltage;
      a second voltage circuit configured to generate a second ET voltage based on a second supply voltage and a second time-variant target voltage;
      a supply voltage circuit configured to generate a plurality of supply voltages; and
      a control circuit coupled to the supply voltage circuit and configured to:
         dynamically select the first supply voltage from the plurality of supply voltages based on the first time-variant target voltage;
         provide the selected first supply voltage to the first voltage circuit;
         dynamically select the second supply voltage from the plurality of supply voltages based on the second time-variant target voltage; and
         provide the selected second supply voltage to the second voltage circuit.

2. The multi-amplifier ET apparatus of claim 1 further comprising:
   a first power amplifier circuit coupled to the ETIC and configured to amplify a first radio frequency (RF) signal based on the first ET voltage, wherein the first time-variant target voltage tracks a time-variant power envelope of the first RF signal; and
   a second power amplifier circuit coupled to the ETIC and configured to amplify a second RF signal based on the second ET voltage, wherein the second time-variant target voltage tracks a time-variant power envelope of the second RF signal.

3. The multi-amplifier ET apparatus of claim 2 wherein the first power amplifier circuit and the second power amplifier circuit are configured to amplify the first RF signal and the second RF signal concurrently.

4. The multi-amplifier ET apparatus of claim 2 wherein:
the first power amplifier circuit is configured to amplify the first RF signal to a first power; and
the second power amplifier circuit is configured to amplify the second RF signal to a second power different from the first power.

5. The multi-amplifier ET apparatus of claim 2 wherein:
the first power amplifier circuit is configured to amplify the first RF signal to a first power; and
the second power amplifier circuit is configured to amplify the second RF signal to a second power identical to the first power.

6. The multi-amplifier ET apparatus of claim 1 wherein:
the first voltage circuit comprises:
 a first voltage amplifier configured to generate a first initial ET voltage based on the first supply voltage and track the first time-variant target voltage; and
 a first offset capacitor configured to raise the first initial ET voltage by a first offset voltage to generate the first ET voltage; and
the second voltage circuit comprises:
 a second voltage amplifier configured to generate a second initial ET voltage based on the second supply voltage and track the second time-variant target voltage; and
 a second offset capacitor configured to raise the second initial ET voltage by a second offset voltage to generate the second ET voltage.

7. The multi-amplifier ET apparatus of claim 6 wherein the ETIC further comprises:
a multi-level charge pump (MCP) configured to generate a low-frequency voltage that is proportional to a battery voltage; and
a power inductor configured to induce a low-frequency current based on the low-frequency voltage.

8. The multi-amplifier ET apparatus of claim 6 wherein the plurality of supply voltages comprises a low constant voltage and a high constant voltage greater than the low constant voltage.

9. The multi-amplifier ET apparatus of claim 8 wherein the control circuit is further configured to:
provide the low constant voltage to the first voltage amplifier as the first supply voltage when the first time-variant target voltage is below a first threshold voltage;
provide the high constant voltage to the first voltage amplifier as the first supply voltage when the first time-variant target voltage is above the first threshold voltage;
provide the low constant voltage to the second voltage amplifier as the second supply voltage when the second time-variant target voltage is below a second threshold voltage; and
provide the high constant voltage to the second voltage amplifier as the second supply voltage when the second time-variant target voltage is above the second threshold voltage.

10. The multi-amplifier ET apparatus of claim 8 wherein the control circuit is further configured to:
provide the low constant voltage to the first voltage amplifier as the first supply voltage when the first time-variant target voltage is below a first threshold voltage;
provide the high constant voltage to the first voltage amplifier as the first supply voltage when the first time-variant target voltage is above the first threshold voltage; and
provide the high constant voltage to the second voltage amplifier as the second supply voltage.

11. The multi-amplifier ET apparatus of claim 8 wherein the control circuit is further configured to:
provide the low constant voltage to the first voltage amplifier as the first supply voltage when the first time-variant target voltage is below a first threshold voltage;
provide the high constant voltage to the first voltage amplifier as the first supply voltage when the first time-variant target voltage is above the first threshold voltage; and
provide the low constant voltage to the second voltage amplifier as the second supply voltage.

12. The multi-amplifier ET apparatus of claim 8 wherein the supply voltage circuit comprises:
a supply multi-level charge pump (MCP) configured to generate a low-frequency supply voltage that is proportional to a battery voltage;
a supply power inductor configured to induce a low-frequency supply current based on the low-frequency supply voltage;
a lower voltage path coupled to the supply power inductor and configured to output the low-frequency supply voltage as the low constant voltage; and
a higher voltage path coupled to the supply power inductor and configured to boost the low-frequency supply voltage to generate the high constant voltage.

13. The multi-amplifier ET apparatus of claim 6 wherein the plurality of supply voltages comprises:
a first modulated voltage that is modulated based on the first time-variant target voltage; and
a second modulated voltage that is modulated based on the second time-variant target voltage.

14. The multi-amplifier ET apparatus of claim 13 wherein the control circuit is further configured to:
provide the first modulated voltage to the first voltage amplifier as the first supply voltage; and
provide the second modulated voltage to the second voltage amplifier as the second supply voltage.

15. The multi-amplifier ET apparatus of claim 14 wherein the supply voltage circuit comprises:
a first amplifier configured to generate a first initial modulated voltage based on a first voltage and the first time-variant target voltage;
a first capacitor configured to raise the first initial modulated voltage to generate the first modulated voltage;
a second amplifier configured to generate a second initial modulated voltage based on a second voltage and the second time-variant target voltage; and
a second capacitor configured to raise the second initial modulated voltage to generate the second modulated voltage.

16. The multi-amplifier ET apparatus of claim 15 wherein the supply voltage circuit further comprises:
a supply multi-level charge pump (MCP) configured to generate a low-frequency supply voltage that is proportional to a battery voltage;
a supply power inductor configured to induce a low-frequency supply current based on the low-frequency supply voltage;

a first low-dropout (LDO) circuit coupled to the supply power inductor and configured to generate the first voltage based on the low-frequency supply voltage; and a second LDO circuit coupled to the supply power inductor and configured to generate the second voltage based on the low-frequency supply voltage.

17. The multi-amplifier ET apparatus of claim 16 wherein the supply voltage circuit further comprises a controller configured to provide a reference voltage to the first LDO circuit and the second LDO circuit for generating the first voltage and the second voltage.

18. The multi-amplifier ET apparatus of claim 17 wherein the controller is further configured to:
receive a first low target voltage corresponding to a minimum of the first time-variant target voltage;
receive a second low target voltage corresponding to a minimum of the second time-variant target voltage; and
generate the reference voltage as a higher one of the first low target voltage and the second low target voltage.

19. The multi-amplifier ET apparatus of claim 18 wherein the controller is further configured to generate the reference voltage as a constant voltage.

20. The multi-amplifier ET apparatus of claim 18 wherein the controller is further configured to generate the reference voltage as a modulated voltage.

21. A wireless device comprising a multi-amplifier envelope tracking (ET) apparatus, the multi-amplifier ET apparatus comprises:
an ET integrated circuit (ETIC) comprising:
a first voltage circuit configured to generate a first ET voltage based on a first supply voltage and a first time-variant target voltage;
a second voltage circuit configured to generate a second ET voltage based on a second supply voltage and a second time-variant target voltage;
a supply voltage circuit configured to generate a plurality of supply voltages; and
a control circuit coupled to the supply voltage circuit and configured to:
dynamically select the first supply voltage from the plurality of supply voltages based on the first time-variant target voltage;
provide the selected first supply voltage to the first voltage circuit;
dynamically select the second supply voltage from the plurality of supply voltages based on the second time-variant target voltage; and
provide the selected second supply voltage to the second voltage circuit.

* * * * *